(12) United States Patent
Hada et al.

(10) Patent No.: US 12,166,008 B2
(45) Date of Patent: Dec. 10, 2024

(54) INJECTION MOLDED SOLDER HEAD WITH IMPROVED SEALING PERFORMANCE

(71) Applicant: INTERNATIONAL BUSINESS MACHINES CORPORATION, Armonk, NY (US)

(72) Inventors: Sayuri Hada, Machida (JP); Toyohiro Aoki, Yokohama (JP); Takashi Hisada, Hachiouji (JP); Shintaro Yamamichi, Kunitachi (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 323 days.

(21) Appl. No.: 17/529,646

(22) Filed: Nov. 18, 2021

(65) Prior Publication Data
US 2023/0154887 A1 May 18, 2023

(51) Int. Cl.
*H01L 23/00* (2006.01)
(52) U.S. Cl.
CPC ............ *H01L 24/742* (2013.01); *H01L 24/11* (2013.01); *H01L 2224/11312* (2013.01); *H01L 2224/1184* (2013.01); *H01L 2224/742* (2013.01); *H01L 2224/749* (2013.01)
(58) Field of Classification Search
CPC ............ H01L 24/742; H01L 2224/742; H01L 2224/749; H01L 2224/75102; H01L 2224/75153; H01L 2224/75301–75303; B23K 3/0638
See application file for complete search history.

(56) References Cited

U.S. PATENT DOCUMENTS

| | | | | |
|---|---|---|---|---|
| 4,934,309 A | * | 6/1990 | Ledermann | B23K 3/06 118/74 |
| 5,565,033 A | * | 10/1996 | Gaynes | H01L 21/4853 118/301 |
| 6,273,328 B1 | | 8/2001 | Maeda et al. | |
| 6,783,797 B2 | * | 8/2004 | Bourrieres | B65B 3/06 427/350 |
| 7,513,410 B2 | | 4/2009 | Biggs et al. | |
| 8,181,846 B2 | * | 5/2012 | Budd | B23K 1/0016 228/256 |

(Continued)

FOREIGN PATENT DOCUMENTS

KR 20110064342 A 6/2011

OTHER PUBLICATIONS

International Search Report from PCT/EP2022/081330 dated Jan. 31, 2023. (29 pages).

(Continued)

*Primary Examiner* — David A Zarneke
(74) *Attorney, Agent, or Firm* — Tutunjian & Bitetto, P.C.; Robert Richard Aragona

(57) ABSTRACT

An apparatus for injecting solder material in via holes located in a top surface of a wafer is provided. The apparatus includes an injection head having a contact surface for contacting the top surface of the wafer, and at least one aperture for injecting the solder material though the injection head into the via holes. The apparatus further includes an evacuating device connected to the injection head for evacuating gas from the via holes. The injection head has a chamfer part on an edge of a contact surface contacting the top surface of the wafer.

18 Claims, 10 Drawing Sheets

(56) References Cited

U.S. PATENT DOCUMENTS

| | | | |
|---|---|---|---|
| 8,191,498 B2* | 6/2012 | Hein | H05K 3/4053 |
| | | | 141/69 |
| 10,639,822 B2* | 5/2020 | Okano | B29C 39/026 |
| 11,298,769 B2* | 4/2022 | Aoki | B23K 1/20 |
| 2005/0263571 A1 | 12/2005 | Belanger et al. | |
| 2008/0014406 A1 | 1/2008 | Chey et al. | |
| 2008/0185118 A1 | 8/2008 | Schultz | |
| 2008/0302860 A1 | 12/2008 | Biggs et al. | |
| 2009/0039140 A1* | 2/2009 | Bezama | H05K 3/3457 |
| | | | 228/41 |
| 2012/0234902 A1 | 9/2012 | Chey et al. | |
| 2012/0305631 A1 | 12/2012 | Feger et al. | |
| 2014/0224860 A1 | 8/2014 | Biggs et al. | |
| 2020/0361013 A1 | 11/2020 | Aoki et al. | |

OTHER PUBLICATIONS

Nah, Jae-Woong, et al. "Wafer IMS (Injection molded solder)—A new fine pitch solder bumping technology on wafers with solder alloy composition flexibility", In2014 IEEE 64th Electronic Components and Technology Conference (ECTC). May 27, 2014, pp. 1308-1313.

Office Action from TW 111127547 dated Mar. 1, 2023. (7 pages).

\* cited by examiner

INJECTION MOLDED SOLDER HEAD WITH IMPROVED SEALING PERFORMANCE

BACKGROUND

The present invention generally relates to integrated circuits, and more particularly to injection molded solder head with improved sealing performance.

Injection Molded Solder (IMS) technology is a solder bumping technology in electronic packaging area. In this technology, the solder bumps are created by injecting melted solder in vias formed in the photoresist layer on a silicon wafer.

One of the challenges in fine pitch bumping with IMS is the solder bump height variation. As the bump pitch becomes smaller, the height of the bumps also decreases. Therefore, even a slight height variation of several micron level becomes significant. The bump height variation leads to electrical short, non-wet of the interconnections and other mechanical failures.

The IMS head is made by rubber covered with a thin PTFE sheet. The surface analysis of the IMS head revealed that the surface roughness of the IMS head can be as much as several dozen microns at room temperature. Since the solder bump height is determined by the scraping of molten solder by the IMS head surface, the surface roughness of the head is directly reflected on the height variation of solder bumps.

Another challenge in fine pitch IMS is the missing solder in vias. Injection of molten solder into smaller holes becomes increasingly difficult due to the surface tension of molten solder and the residual gas pressure in vias.

One of the solutions to this challenge is to increase the injection pressure. However, when the injection pressure is increased, the load applied on the head also needs to be increased to prevent solder leakage. Increasing of the load improves the sealing of the vacuum and therefore reduces residual gas pressure in the vias. However, a higher load increases the frictional force between the head and the wafer resulting in early deterioration of the head rubber.

SUMMARY

According to aspects of the present invention, an apparatus for injecting solder material in via holes located in a top surface of a wafer is provided. The apparatus includes an injection head having a contact surface for contacting the top surface of the wafer, and at least one aperture for injecting the solder material though the injection head into the via holes. The apparatus further includes an evacuating device connected to the injection head for evacuating gas from the via holes. The injection head has a chamfer part on an edge of a contact surface contacting the top surface of the wafer.

According to other aspects of the present invention, an apparatus for injecting solder material in via holes located in a top surface of a wafer is provided. The apparatus includes an injection head having a contact surface for contacting the top surface of the wafer, and a plurality of apertures for injecting the solder material though one or more solder tanks of the injection head into the via holes. The apparatus further includes an evacuating device connected to the injection head for evacuating gas from the via holes. The injection head has a chamfer part on an edge of a contact surface contacting the top surface of the wafer and at least one chamfer part contacting at least one of the plurality of apertures.

According to yet other aspects of the present invention, a method for injecting solder material in via holes located in a top surface of a wafer is provided. The method includes evacuating, by an evacuating device, gas from the via holes. The method further includes injecting the solder material into the via holes, by an injection head connected to the evacuating device and having a contact surface for contacting the top surface of the wafer, and at least one aperture for solder injection to form a solder bump. The method also includes moving the injection head so as to move a chamfer part of an edge of the injection head over the solder bump to scrape the solder bump to an intended height.

According to still other aspects of the present invention, a method for injecting solder material in via holes located in a top surface of a wafer is provided. The method includes evacuating, by an evacuating device, gas from the via holes. The method further includes injecting the solder material into the via holes, by an injection head connected to the evacuating device and having a contact surface for contacting the top surface of the wafer, and a plurality of aperture for solder injection to form one or more solder bumps. The method also includes moving the injection head so as to move a chamfer part of an edge of the injection head over the one or more solder bumps to scrape the one or more solder bumps to an intended height.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention are directed to Injection Molded Solder (IMS) head with improved sealing performance.

The original IMS head has square shaped edges. It has been found that the sealing at the edges of the head can be improved by chamfering, since chamfering increases the vertical stress locally at the edges. One or more embodiments of the present invention use chamfered edges to solve the above two challenges described in the background section.

Regarding solder bump height variation, in view of it having been determined that a higher level of vacuum improves the solder bump height variation, embodiments of the present invention apply chamfered edges to seal the space between the head and the wafer to increase the vacuum performance. It also has been determined that higher contact pressure improves the bump height variation. Higher vertical stress of the chamfered edges also can be used to level off the molten solder by scraping.

Regarding missing solder in vias, embodiments of the present invention add a second injection slit to compensate the missing solder in vias. Since a higher level of vacuum is needed for the second injection slit to work, embodiments of the present invention chamfer the edges for a superior sealing. Embodiments of the present invention also create the surfaces with differential roughness: a rough surface for a better conductance; and a smooth surface for a better sealing.

Figure 1:
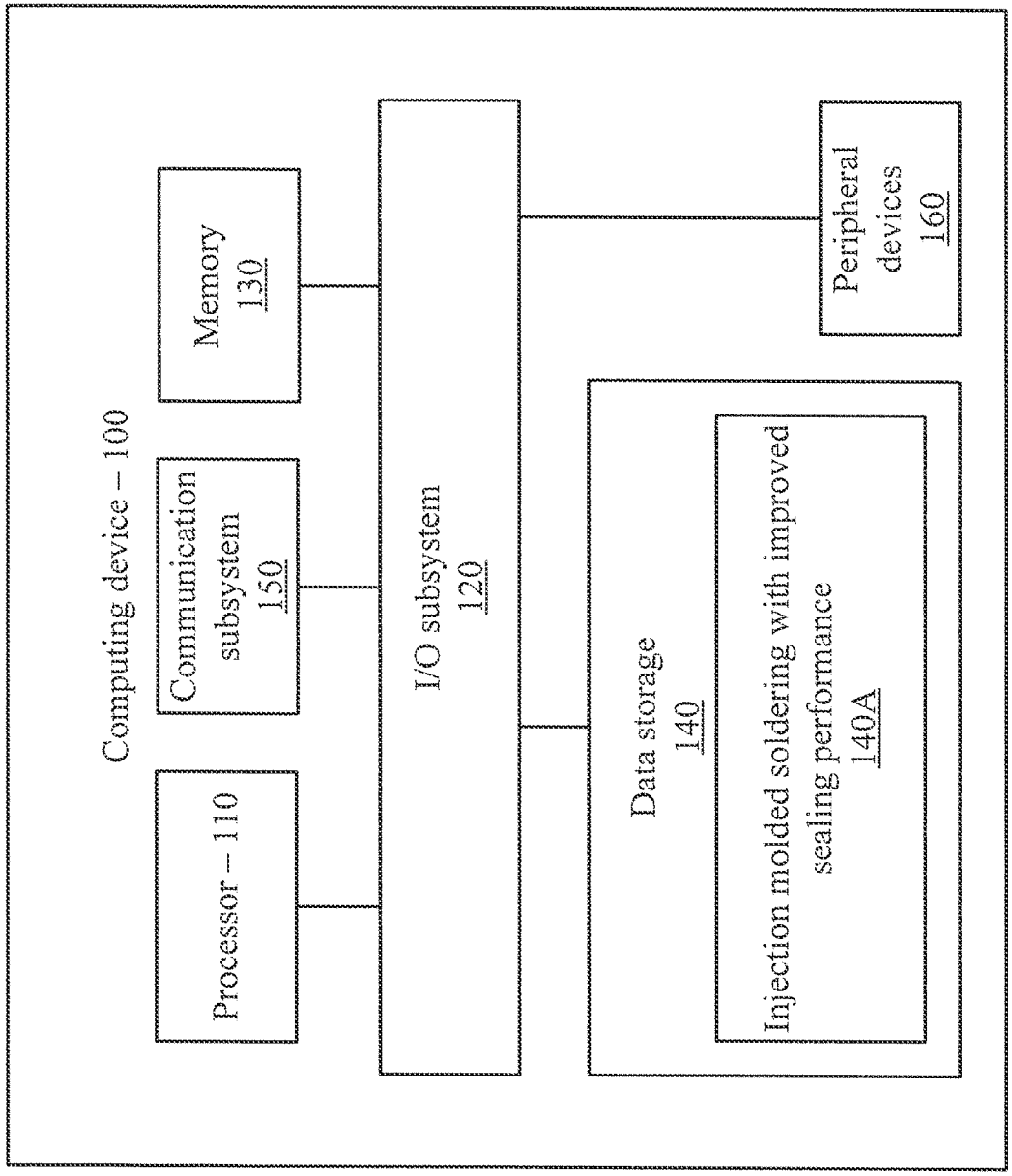
FIG. 1 is a block diagram showing an exemplary computing device, in accordance with an embodiment of the present invention.

FIG. 1 is a block diagram showing an exemplary computing device 100, in accordance with an embodiment of the present invention. Computing device 100 can be used to control an integrated circuit manufacturing line or manufacturing line portion. The computing device 100 is configured to provide an injection molded solder head with improved sealing performance.

The computing device 100 may be embodied as any type of computation or computer device capable of performing the functions described herein, including, without limitation, a computer, a server, a rack based server, a blade server, a workstation, a desktop computer, a laptop computer, a notebook computer, a tablet computer, a mobile computing device, a wearable computing device, a network appliance, a web appliance, a distributed computing system, a processor-based system, and/or a consumer electronic device. Additionally or alternatively, the computing device 100 may be embodied as a one or more compute sleds, memory sleds, or other racks, sleds, computing chassis, or other components of a physically disaggregated computing device. As shown in FIG. 1, the computing device 100 illustratively includes the processor 110, an input/output subsystem 120, a memory 130, a data storage device 140, and a communication subsystem 150, and/or other components and devices commonly found in a server or similar computing device. Of course, the computing device 100 may include other or additional components, such as those commonly found in a server computer (e.g., various input/output devices), in other embodiments. Additionally, in some embodiments, one or more of the illustrative components may be incorporated in, or otherwise form a portion of, another component. For example, the memory 130, or portions thereof, may be incorporated in the processor 110 in some embodiments.

The processor 110 may be embodied as any type of processor capable of performing the functions described herein. The processor 110 may be embodied as a single processor, multiple processors, a Central Processing Unit(s) (CPU(s)), a Graphics Processing Unit(s) (GPU(s)), a single or multi-core processor(s), a digital signal processor(s), a microcontroller(s), or other processor(s) or processing/controlling circuit(s).

The memory 130 may be embodied as any type of volatile or non-volatile memory or data storage capable of performing the functions described herein. In operation, the memory 130 may store various data and software used during operation of the computing device 100, such as operating systems, applications, programs, libraries, and drivers. The memory 130 is communicatively coupled to the processor 110 via the I/O subsystem 120, which may be embodied as circuitry and/or components to facilitate input/output operations with the processor 110 the memory 130, and other components of the computing device 100. For example, the I/O subsystem 120 may be embodied as, or otherwise include, memory controller hubs, input/output control hubs, platform controller hubs, integrated control circuitry, firmware devices, communication links (e.g., point-to-point links, bus links, wires, cables, light guides, printed circuit board traces, etc.) and/or other components and subsystems to facilitate the input/output operations. In some embodiments, the I/O subsystem 120 may form a portion of a system-on-a-chip (SOC) and be incorporated, along with the processor 110, the memory 130, and other components of the computing device 100, on a single integrated circuit chip.

The data storage device 140 may be embodied as any type of device or devices configured for short-term or long-term storage of data such as, for example, memory devices and circuits, memory cards, hard disk drives, solid state drives, or other data storage devices. The data storage device 140 can store program code for providing an injection molded solder head with improved sealing performance. The communication subsystem 150 of the computing device 100 may be embodied as any network interface controller or other communication circuit, device, or collection thereof, capable of enabling communications between the computing device 100 and other remote devices over a network. The communication subsystem 150 may be configured to use any one or more communication technology (e.g., wired or wireless communications) and associated protocols (e.g., Ethernet, InfiniBand®, Bluetooth®, Wi-Fi®, WiMAX, etc.) to effect such communication.

As shown, the computing device 100 may also include one or more peripheral devices 160. The peripheral devices 160 may include any number of additional input/output devices, interface devices, and/or other peripheral devices. For example, in some embodiments, the peripheral devices 160 may include a display, touch screen, graphics circuitry, keyboard, mouse, speaker system, microphone, network interface, and/or other input/output devices, interface devices, and/or peripheral devices.

Of course, the computing device 100 may also include other elements (not shown), as readily contemplated by one of skill in the art, as well as omit certain elements. For example, various other input devices and/or output devices can be included in computing device 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized. These and other variations of the processing system 100 are readily contemplated by one of ordinary skill in the art given the teachings of the present invention provided herein.

As employed herein, the term "hardware processor subsystem" or "hardware processor" can refer to a processor, memory (including RAM, cache(s), and so forth), software (including memory management software) or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result. Such circuitry can include one or more application-specific integrated circuits (ASICs), FPGAs, and/or PLAs.

Figure 2:
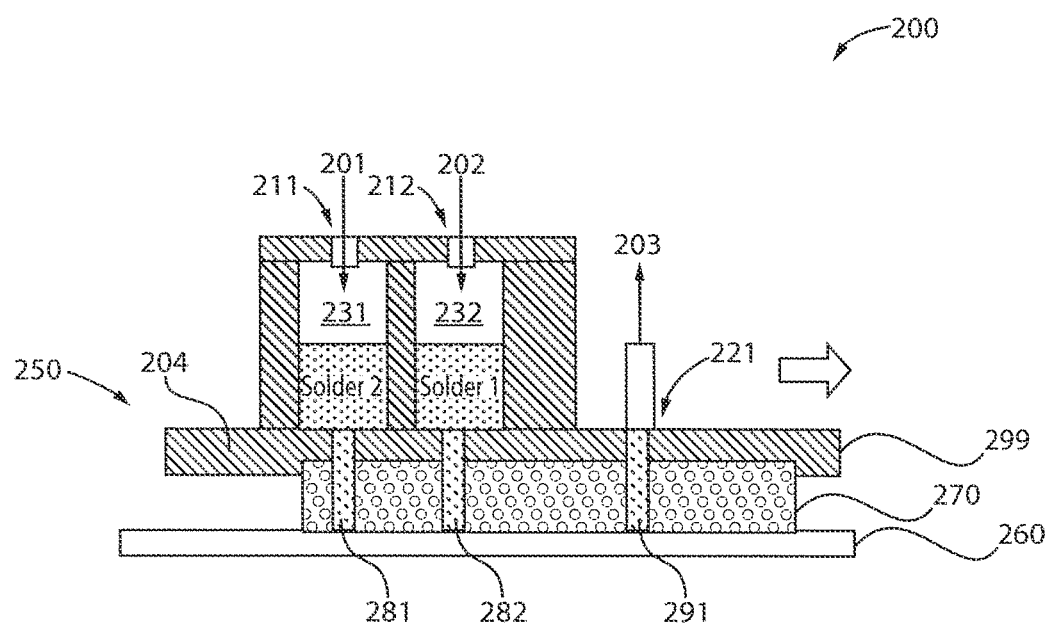
FIG. 2 is a diagram showing an exemplary Injection Molded Solder (IMS) head on a semiconductor device, in accordance with an embodiment of the present invention.

These and other variations of a hardware processor subsystem are also contemplated in accordance with embodiments of the present invention FIG. 2 is a diagram showing an exemplary Injection Molded Solder (IMS) head 200 on a semiconductor device 250, in accordance with an embodiment of the present invention.

The semiconductor device 250 includes a substate 260, a dielectric 270, solder receiving vias 281 and 282, a vacuum receiving via 291, and a wafer 299. While element 291 is deemed a vacuum receiving via, all vias to be filed with solder receive a vacuum first and then are filled with solder by the IMS head as the IMS head moves along and over the wafer 299.

The IMS head 200 includes solder injecting slits 211 and 212, a vacuum applying slit 221, a first solder tank 231, a second solder tank 232, and a vacuum line 244. While shown separate for the sake of illustration, the vacuum line 244 is part of the IMS head 200, as shown in FIGS. 2 and 3.

Pressures involved include a solder pressure 201, a solder pressure 202, a vacuum 203, and a head pressure 204.

Figure 3:
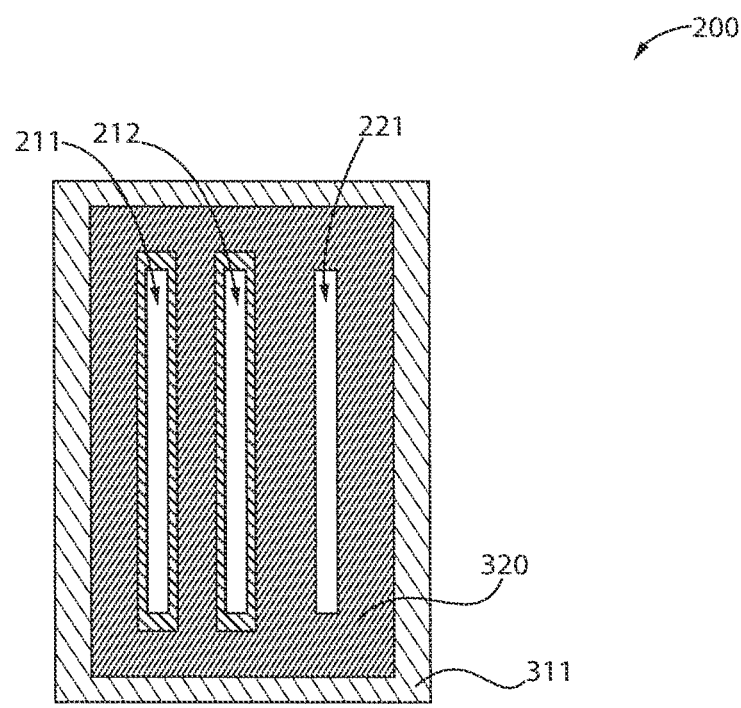
FIG. 3 is a diagram showing a bottom view of the IMS head of FIG. 2, in accordance with an embodiment of the present invention.

FIG. 3 is a diagram showing a bottom view of the IMS head 200 of FIG. 2, in accordance with an embodiment of the present invention.

In this view, the IMS head 200 includes solder injecting slits 211 and 212, a vacuum applying slit 221, Si rubber 320, and a chamfer portion 311. Coupled thermal-mechanical analysis of the IMS head 200 was performed to show the scraping by chamfered edges. The chamfered edge digs into the vias defining the solder height. The solder height variation reduces, since the surface variation at the chamfered edge is smaller than that of the entire head surface. While chamfer portion position is labeled in FIG. 3, as in other figures, the actual chamfer is not shown for the sake of focusing on some other aspect of the FIG. Exemplary chamfers configurations are shown and described in detail with respect to FIGS. 7 through 11.

Figure 4:
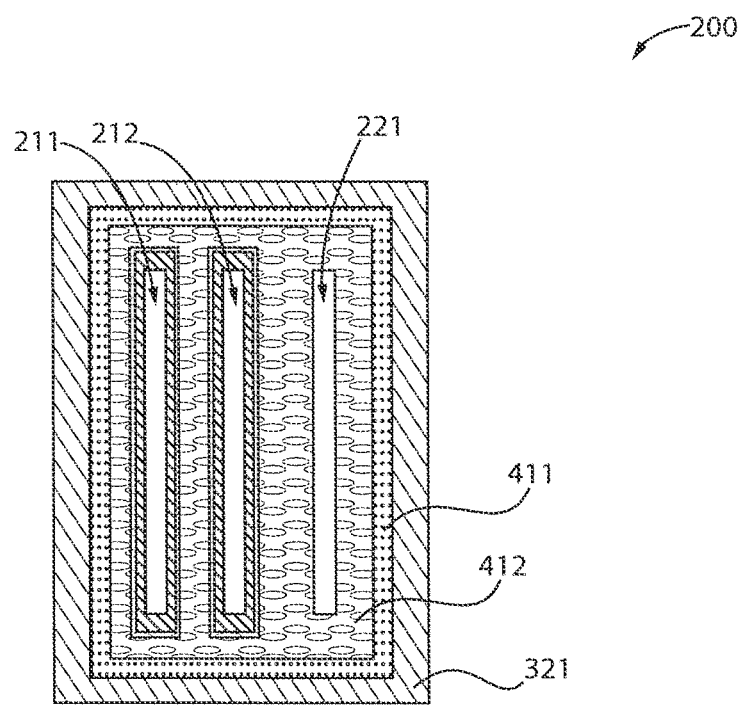
FIG. 4 is a diagram showing another bottom view of the IMS head of FIG. 2, in accordance with an embodiment of the present invention.

FIG. 4 is a diagram showing another bottom view of the IMS head 200 of FIG. 2, in accordance with an embodiment of the present invention.

In this view, the IMS head 200 includes solder injecting slits 211 and 212, a vacuum applying slit 221, a high average roughness area 411, a low average roughness area 412, and a chamfer portion 321.

The high average roughness area 411 corresponds to a higher average roughness surface for better conductance. The high average roughness area 411 can be formed of, for example, but not limited to, Si rubber, Polytetrafluoroethylene (PTFE), polyetherimide (PEI), polyether ether ketone (PEEK), polybenzimidazole (PBI), polydicyclopentadiene (PDCPD), epoxy (EP). An exemplary high average roughness area 411 can involve an average surface roughness within a range of 32 to 400 micro inches. The low average roughness area 412 corresponds to a high stress area with smooth surface for better sealing. The low average roughness area 412 can be formed from a low friction material including, for example, but not limited to, Polytetrafluoroethylene (PTFE), polyetherimide (PEI), polyether ether ketone (PEEK), polybenzimidazole (PBI), polydicyclopentadiene (PDCPD), epoxy (EP). An exemplary low average roughness area 412 can involve an average surface roughness within a range of 8 to 32 micro inches.

The contact surface may include a surface roughness to minimize friction with solder balls. Although the solder balls are in a liquid state, it is desirable to prevent wicking along the surface of the chamfer. Wicking can be minimized if the surface roughness is low (e.g., less than about 32 micro inches).

In addition, material selection preferably includes a dielectric coating. The dielectric coating can include Polytetrafluoroethylene (PTFE), Polyethylene, or other material having a low coefficient of friction and able to withstand the solder temperature without degradation.

The chamfer and/or radius should be sized and configured to maintain the solder ball surface tension. For example, in one embodiment, the angle θ of the chamfer can be an acute angle from having a range of about 1 degree to about 60 degrees.

In other embodiments, a non-linear profile or radius is employed with or in addition to the chamfer. In one embodiment, the radius is between about 0.25 to 7.5 mm. being sized as percentage of the solder ball radius, e.g., a range between 10 to 500 percent.

Figure 5:
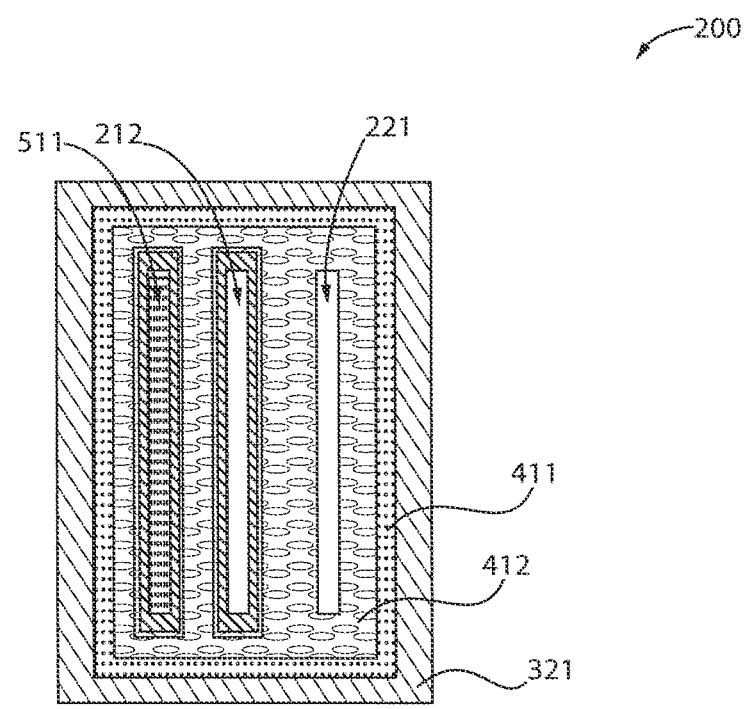
FIG. 5 is a diagram showing yet another bottom view of the IMS head of FIG. 2, in accordance with an embodiment of the present invention.

FIG. 5 is a diagram showing yet another bottom view of the IMS head 200 of FIG. 2, in accordance with an embodiment of the present invention.

In this view, the IMS head 200 includes solder injecting slits 511 and 212, a vacuum applying slit 221, and a chamfer portion 321.

In FIG. 5, the solder injecting slit 511 is sized smaller than solder injecting slit 212, which works fine since it only requires enough solder to correct streaks and/or other small defects in the first application. That is, a primary solder material deposit is made with solder injecting slit 212 followed by a secondary solder material deposit made with solder injecting slit 511.

Figure 6:
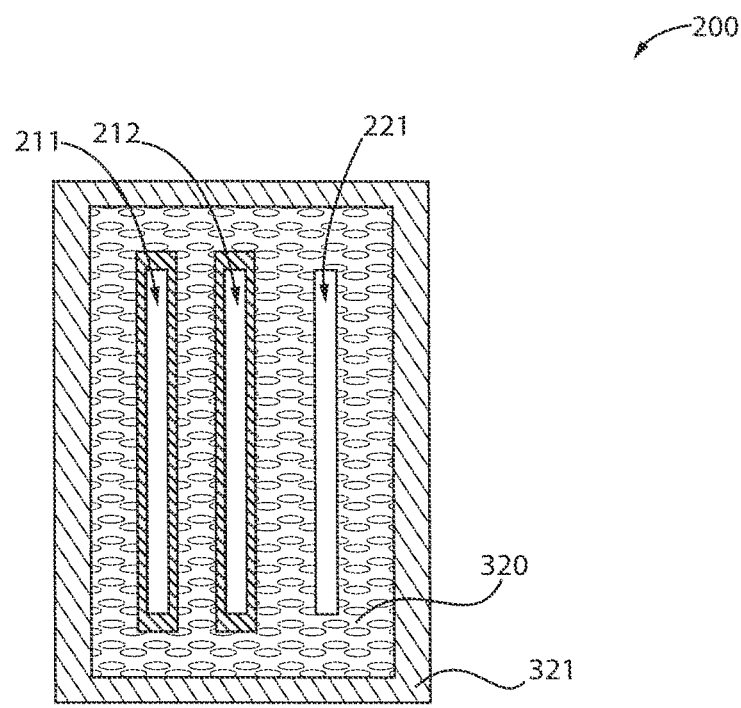
FIG. 6 is a diagram showing still another bottom view of the IMS head of FIG. 2, in accordance with an embodiment of the present invention.

FIG. 6 is a diagram showing still another bottom view of the IMS head 200 of FIG. 2, in accordance with an embodiment of the present invention.

In this view, the IMS head 200 includes solder injecting slits 211 and 212, a vacuum applying slit 221, and a chamfer portion 321.

The embodiment of FIG. 6 differs from that of FIG. 3 in that different solder materials are used for solder inject slits 511 and 512. For example, different solder materials that can be used include, but are not limited to, lead-free solder using tin, indium, a tin alloy, or an indium alloy that contains Ag, Sn, In, Bi, Cu, Sb, Zn, Ni, Pd, Co, Ge, Au and/or Fe.

Different filling pressures can be used for the different solder materials depending on characteristics (e.g., viscosity) of the different solder materials.

Figure 7:
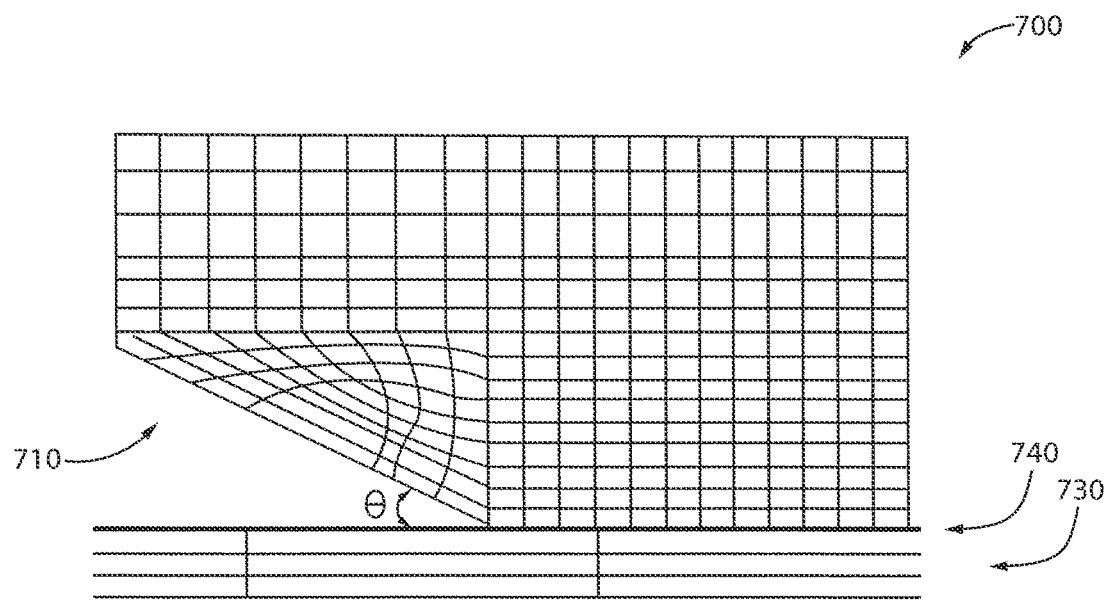
FIG. 7 is a diagram showing a modified back end of an IMS head, in accordance with an embodiment of the present invention.

FIG. 7 is a diagram showing a modified back end 700 of an IMS head, in accordance with an embodiment of the present invention.

The modified back end 700 includes a straight edge chamfer 710. Angle θ has a range from 1 to 60 deg.

The wafer 730 and photoresist 740 are also shown.

Figure 8:
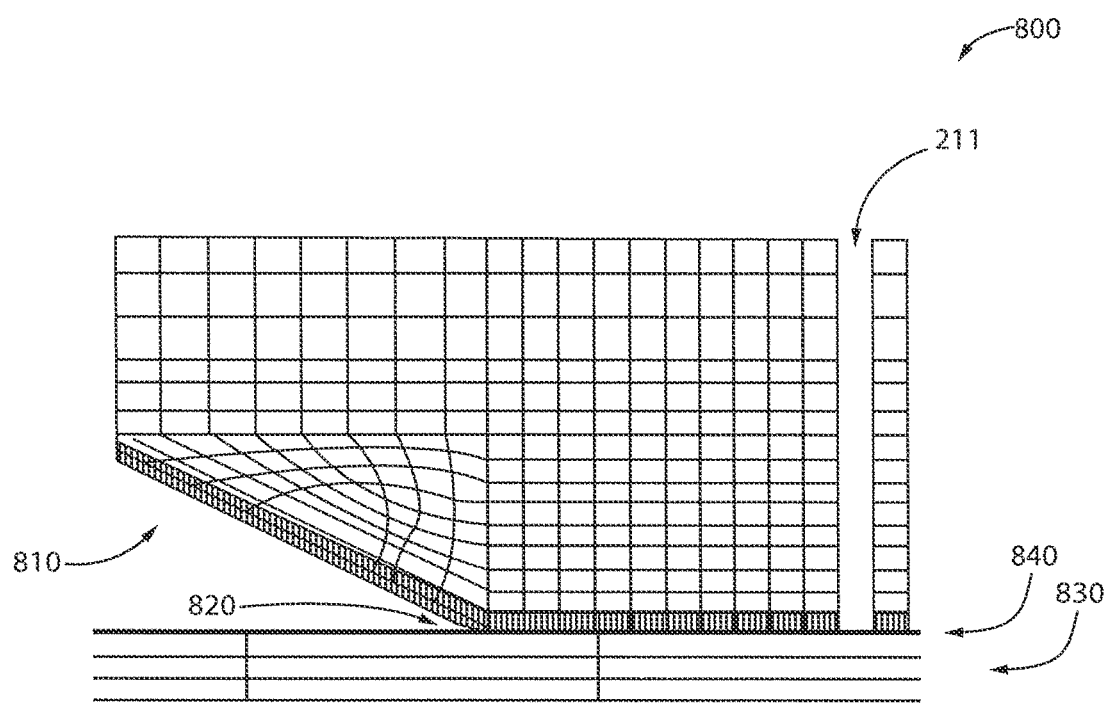
FIG. 8 is a diagram showing another modified back end of an IMS head, in accordance with an embodiment of the present invention.

FIG. 8 is a diagram showing another modified back end 800 of an IMS head, in accordance with an embodiment of the present invention.

The modified backend 800 includes a straight portion 810 and a radiused portion 820 where radius r=0.25 mm as an example.

The wafer 830 and photoresist 840 are also shown.

Figure 9:
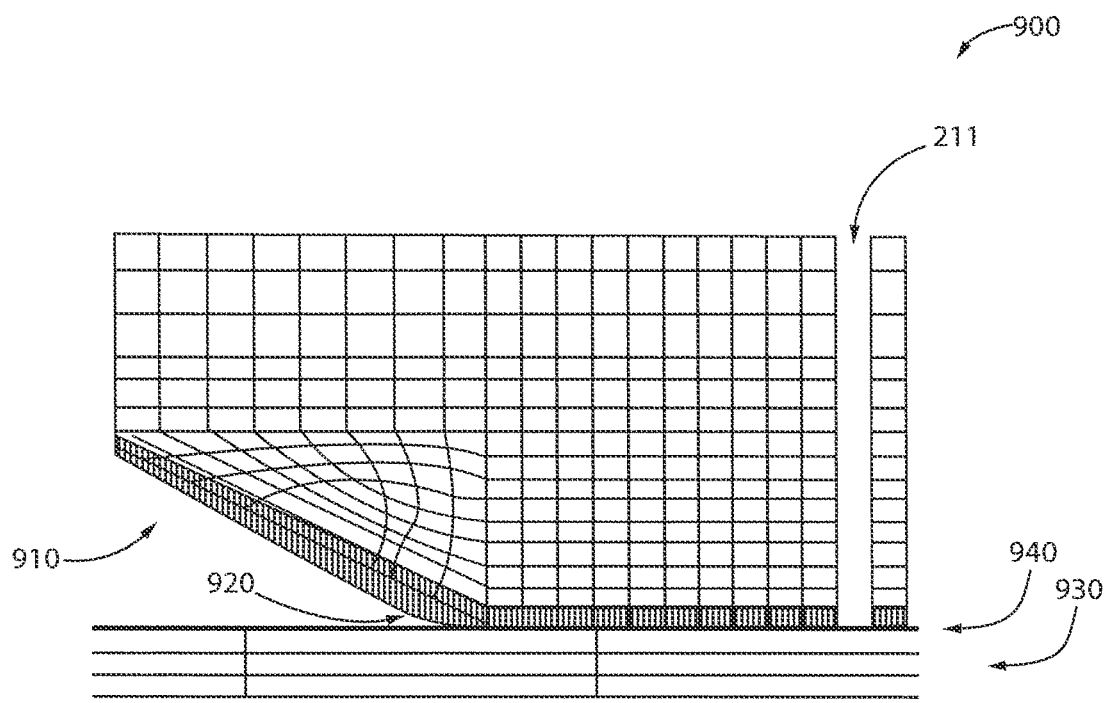
FIG. 9 is a diagram showing another modified back end of an IMS head, in accordance with an embodiment of the present invention.

FIG. 9 is a diagram showing another modified back end 900 of an IMS head, in accordance with an embodiment of the present invention.

The modified backend 900 includes a straight portion 910 and a radiused portion 920 where radius r=0.5 mm. The radiused portion 920 is increased compared to radiused portion 910 by a factor of 2.

The wafer 930 and photoresist 940 are also shown.

Figure 10:
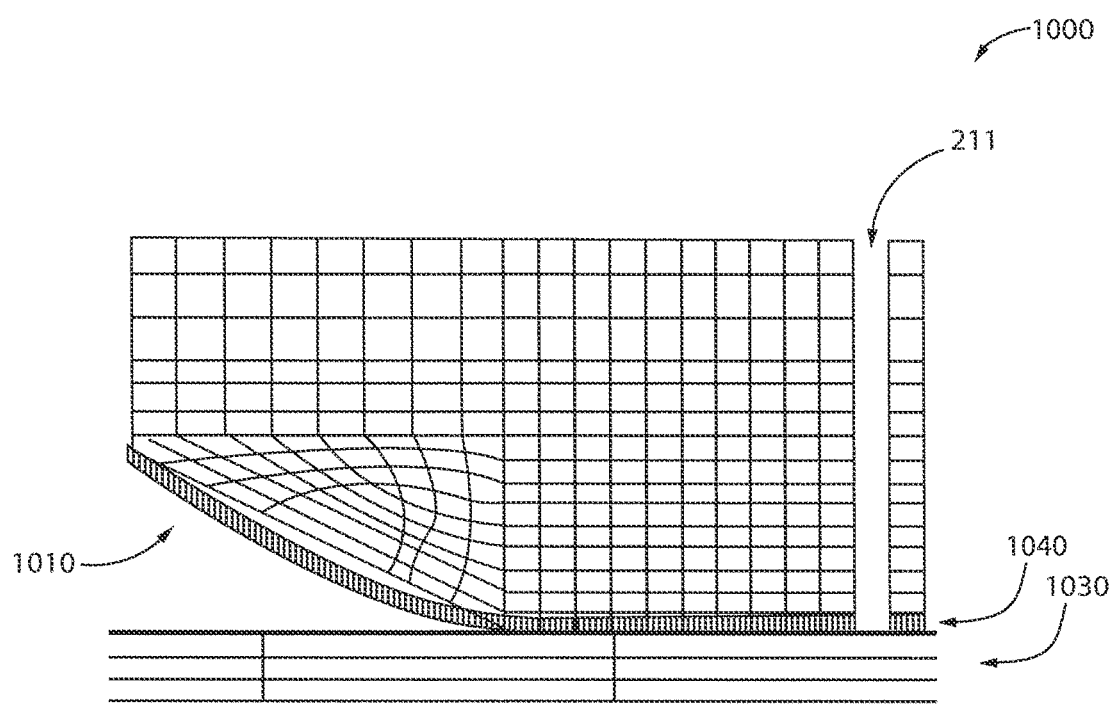
FIG. 10 is a diagram showing another modified back end of an IMS head, in accordance with an embodiment of the present invention.

FIG. 10 is a diagram showing another modified back end 1000 of an IMS head, in accordance with an embodiment of the present invention.

The modified backend 1000 includes a radiused portion 1010 where radius r=3.914 mm.

The wafer 1030 and photoresist 1040 are also shown.

Figure 11:
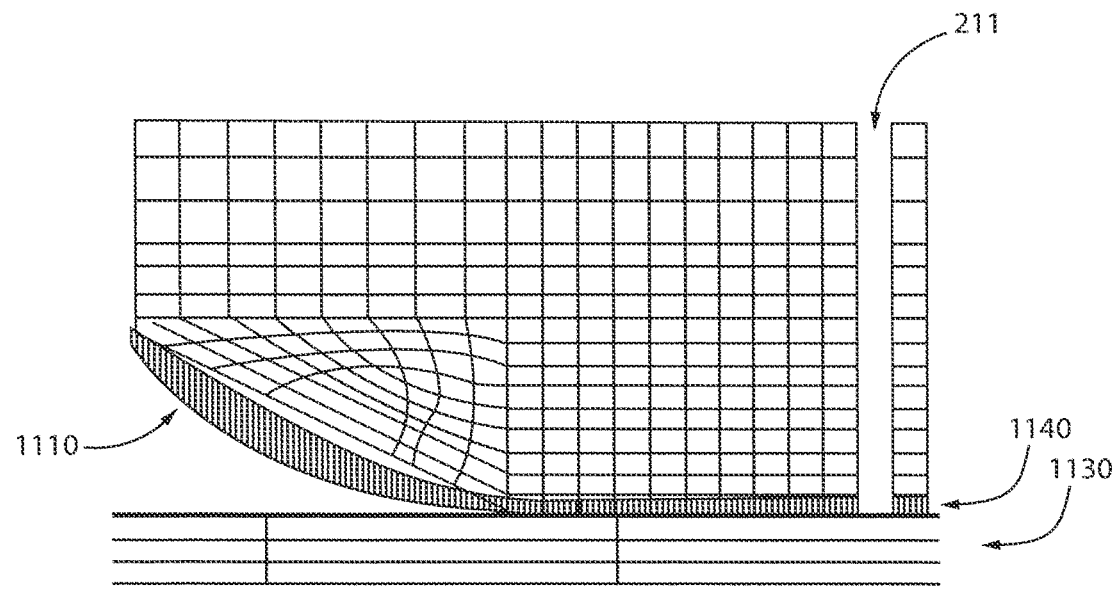
FIG. 11 is a diagram showing another modified back end of an IMS head, in accordance with an embodiment of the present invention.

FIG. 11 is a diagram showing another modified back end 1100 of an IMS head, in accordance with an embodiment of the present invention.

The modified backend 1100 includes a radiused portion 1110 where radius r=7.5 mm.

The wafer 1130 and photoresist 1140 are also shown.

Figure 12:
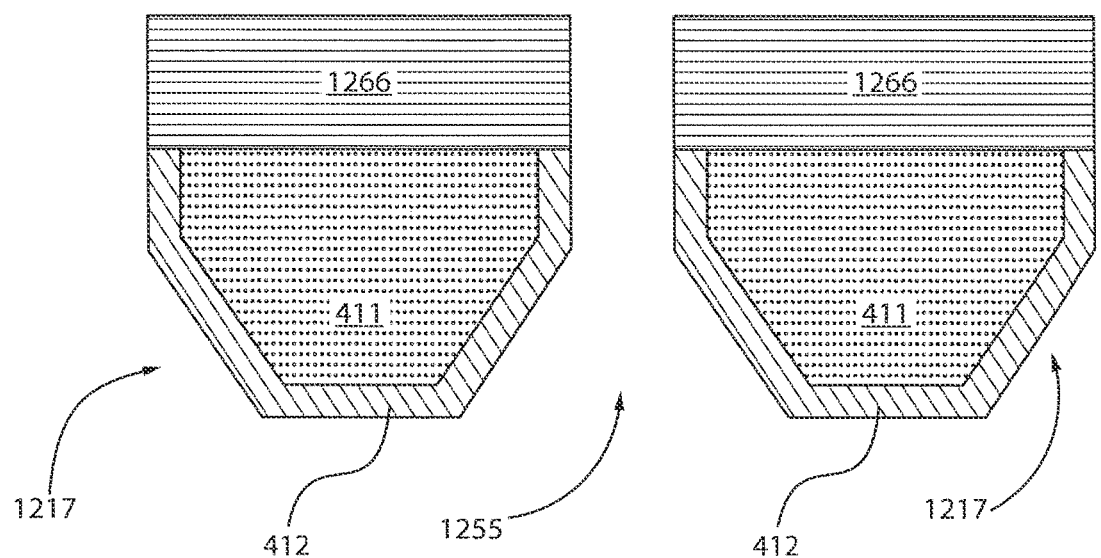
FIG. 12 is a diagram showing the low friction layer of the IMS head, in accordance with an embodiment of the present invention.

FIG. 12 is a diagram showing the low friction layer 412 of the IMS head, in accordance with an embodiment of the present invention.

In addition to the bottom surface, the low friction layer 412 is formed at sidewall including chamfer area 1277 in order to minimize the delamination problem from the rubber 411 (high friction area) attached to a metal 1266. Injection slit is shown by reference numeral 1255.

Figure 13:
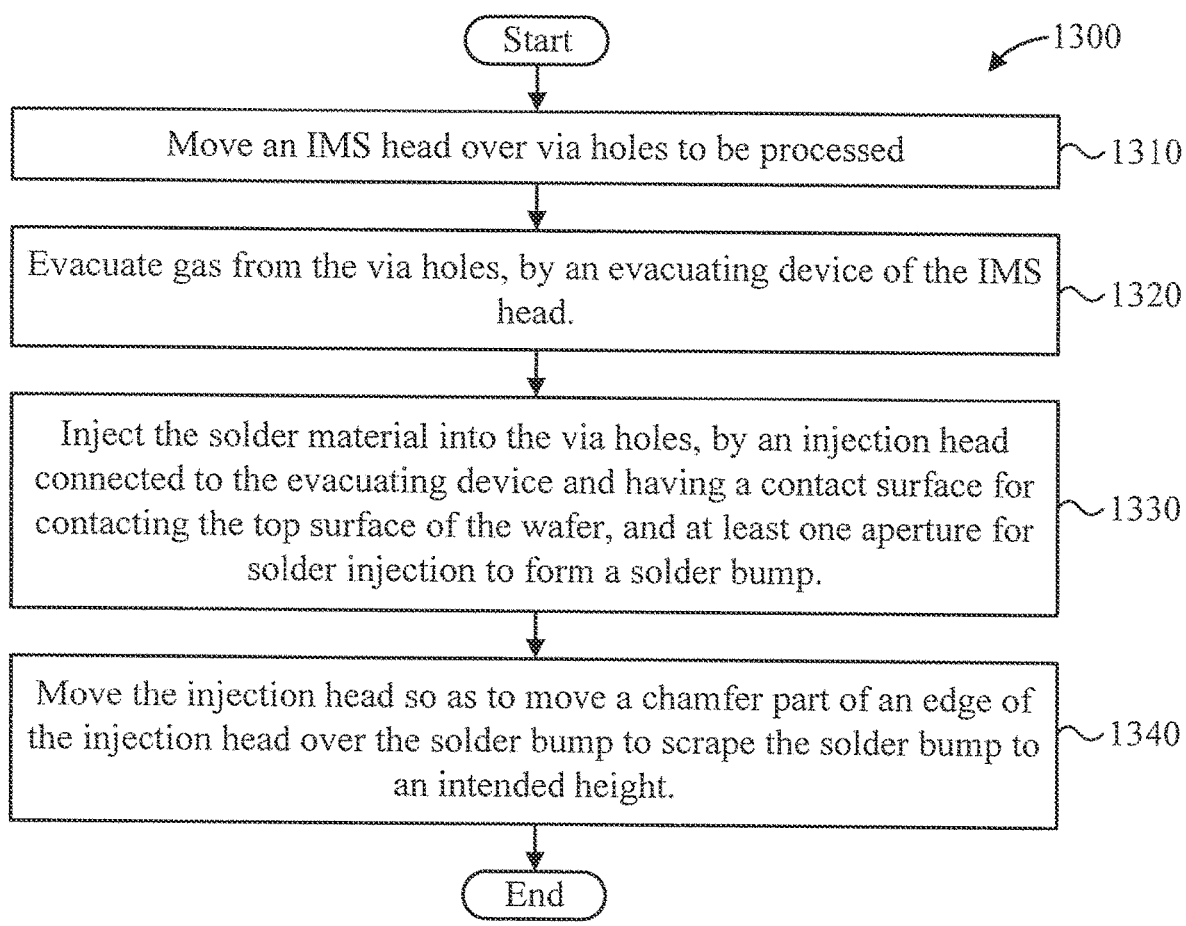
FIG. 13 is a flow diagram showing an exemplary method for injecting solder material in via holes located in a top surface of a wafer, in accordance with an embodiment of the present invention.

FIG. 13 is a flow diagram showing an exemplary method 1300 for injecting solder material in via holes located in a top surface of a wafer, in accordance with an embodiment of the present invention.

At block 1310, move an IMS head over via holes to be processed.

At block 1320, evacuate gas from the via holes, by an evacuating device of the IMS head.

At block 1320, inject the solder material into the via holes, by an injection head connected to the evacuating device and having a contact surface for contacting the top surface of the wafer, and at least one aperture for solder injection to form a solder bump.

At block 1330, move the injection head so as to move a chamfer part of an edge of the injection head over the solder bump to scrape the solder bump to an intended height. Movement of the invention head is from via to via to process the vias as described.

Figure 14:
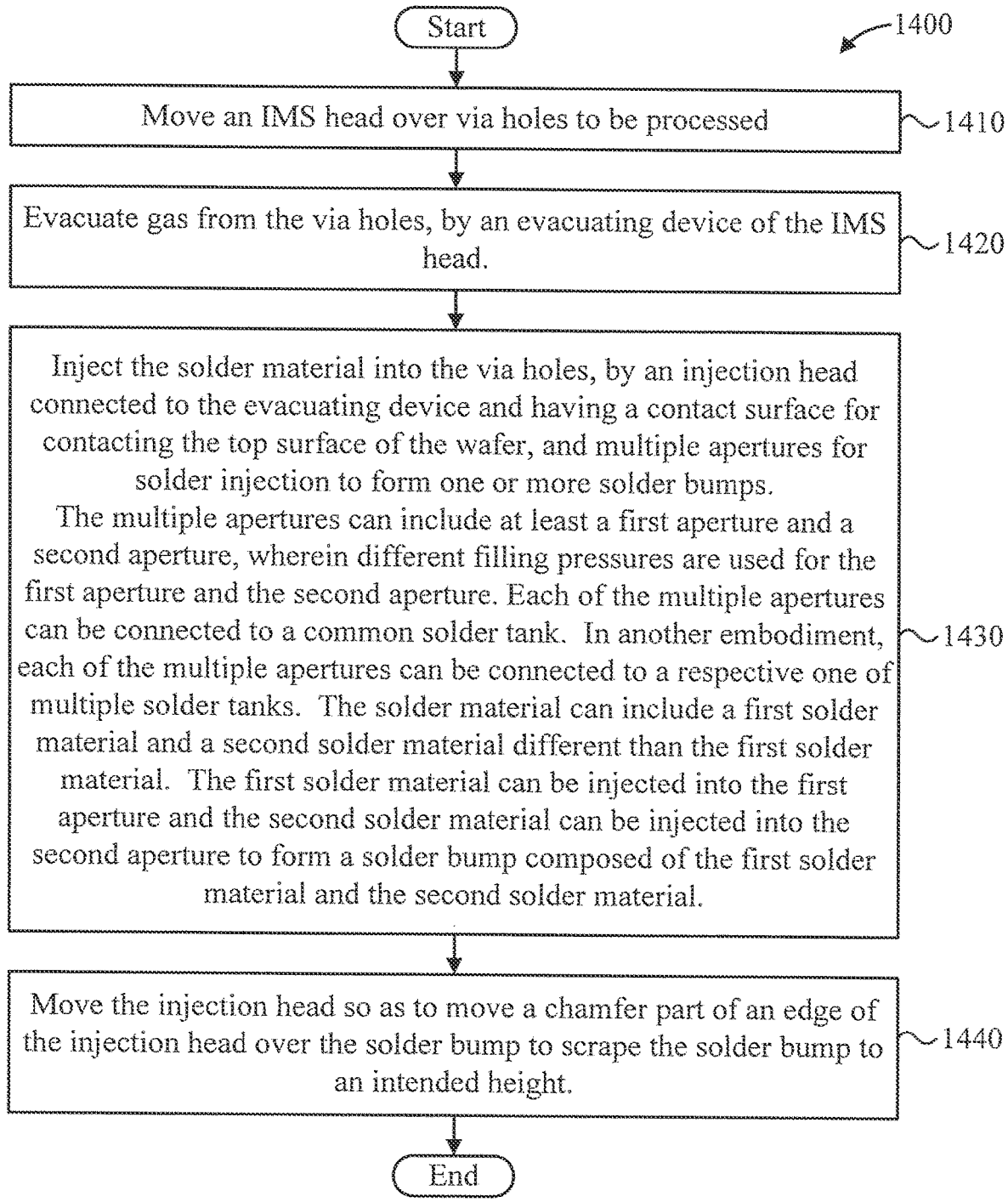
FIG. 14 is a flow diagram showing another exemplary method for injecting solder material in via holes located in a top surface of a wafer, in accordance with an embodiment of the present invention.

FIG. 14 is a flow diagram showing another exemplary method 1400 for injecting solder material in via holes located in a top surface of a wafer, in accordance with an embodiment of the present invention.

At block 1410, move an IMS head over via holes to be processed.

At block 1420, evacuate gas from the via holes, by an evacuating device of the IMS head.

At block 1420, inject the solder material into the via holes, by an injection head connected to the evacuating device and having a contact surface for contacting the top surface of the wafer, and multiple apertures for solder injection to form one or more solder bumps.

In an embodiment, the multiple apertures can include at least a first aperture and a second aperture, and wherein different filling pressures can be used for the first aperture and the second aperture.

In an embodiment, each of the multiple apertures can be connected to a common solder tank. In another embodiment, each of the multiple apertures can be connected to a respective one of multiple solder tanks.

In an embodiment, the solder material can include a first solder material and a second solder material different than the first solder material. The first solder material can be injected into the first aperture and the second solder material can be injected into the second aperture to form a solder bump composed of the first solder material and the second solder material.

At block 1330, move the injection head so as to move a chamfer part of an edge of the injection head over the solder bump to scrape the solder bump to an intended height. The one or more solder bumps are scraped to reduce solder height variation at least one of therebetween and in relation to other solder bumps. Movement of the invention head is from via to via to process the vias as described.

Figure 15:
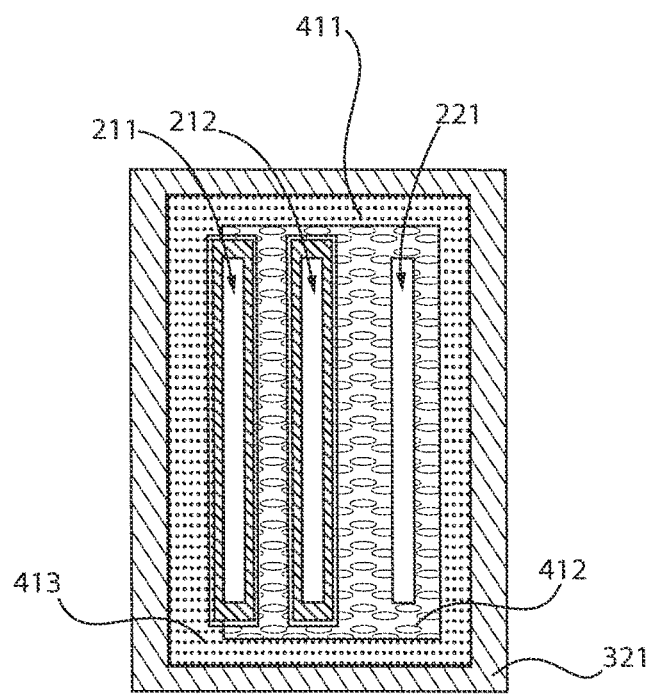
FIG. 15 is a diagram showing yet another bottom view of the IMS head of FIG. 2, in accordance with an embodiment of the present invention.

FIG. 15 is a diagram showing yet another bottom view of the IMS head 200 of FIG. 2, in accordance with an embodiment of the present invention.

In comparison to the variation of IMS head 200 as shown in FIG. 4, there is no higher average roughness area at the back of the second slit 211. Instead, area 413 is a low average roughness area.

Figure 16:
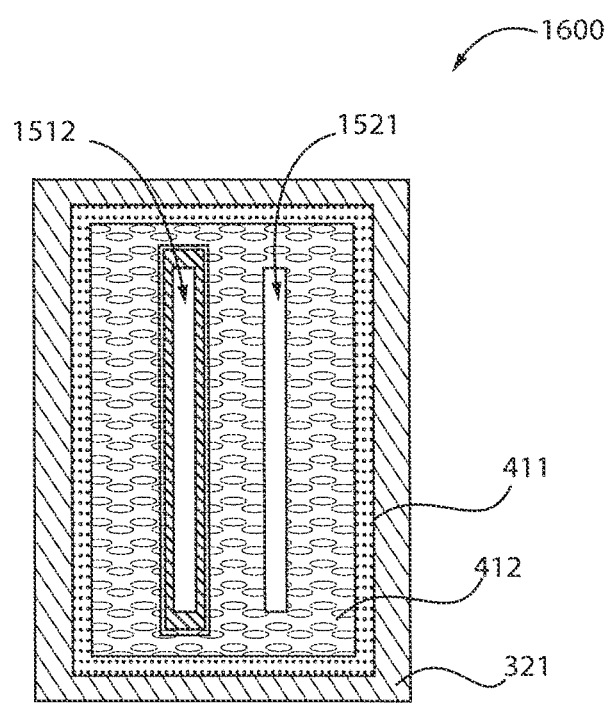
FIG. 16 is a diagram showing a variation of FIG. 4, with one solder injecting slit and one vacuum applying slit, in accordance with an embodiment of the present invention.

FIG. 16 is a diagram showing a variation 1600 of FIG. 4, with one solder injecting slit 1511 and one vacuum applying slit 1521, in accordance with an embodiment of the present invention.

Each of the embodiments shown herein involving two solder injecting slits can also be modified to involve a single solder injecting slit and a single vacuum applying slit as shown in FIG. 16. These and other variations of the present invention are readily contemplated by one of ordinary skill in the art given the teachings of the present invention provided herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. An apparatus for injecting solder material in via holes located in a top surface of a wafer, the apparatus comprising:
an injection head having a contact surface for contacting the top surface of the wafer, and at least one aperture for injecting the solder material though the injection head into the via boles; and
wherein the injection head comprises a low average roughness area proximate to the at least one aperture and a high average roughness area surrounding the low roughness area, the low average roughness area having a lower average roughness than the high average roughness area;
an evacuating device connected to the injection head for evacuating gas from the via holes,
wherein the injection head has a chamfer part on an edge of a contact surface contacting the top surface of the wafer.

2. The apparatus of claim 1, wherein the injection head has a plurality of apertures for injecting the solder material.

3. The apparatus of claim 1, wherein each of the plurality of apertures is connected to a common solder tank.

4. The apparatus of claim 1, wherein each of the plurality of apertures is connected to a respective one of a plurality of solder tanks.

5. The apparatus of claim 1, wherein the chamfer part is on an outer circumference and the at least one aperture of the injection head.

6. The apparatus of claim 5, wherein the chamfer part is on a following edge of the injection head in a forward direction of travel.

7. The apparatus of claim 1, wherein the at least one aperture of the injection bead comprises at least a first aperture and a second aperture.

8. The apparatus of claim 7, wherein an area of the second aperture is smaller than an area of the first aperture.

9. The apparatus of claim 7, wherein the solder material comprises a first solder material and a second solder material different than the first solder material, wherein first solder material is injected into the first aperture and the second solder material is injected into the second aperture to form a solder bump comprising the first solder material and the second solder material.

10. The apparatus of claim 7, wherein different filling pressures are used for the first aperture and the second aperture.

11. The apparatus of claim 1, wherein the chamfered portion consists of a straight edge.

12. The apparatus of claim 1, wherein the chamfered portion comprises a radiused portion.

13. The apparatus of claim 1, wherein the injection head comprises a differential roughness, with a rough surface and a smoothed surface surrounding the rough surface.

14. An apparatus for injecting solder material in via holes located in a top surface of a wafer, the apparatus comprising;
an injection head having a contact surface for contacting the top surface of the wafer, and a plurality of apertures for injecting the solder material though one or more solder tanks of the injection head into the via holes; and
wherein the injection head comprises a low average roughness area proximate to the at least one aperture and a high average roughness area surrounding the low roughness area, the low average roughness area having a lower average roughness than the high average roughness area;
an evacuating device connected to the injection head for evacuating gas from the via holes,
wherein the injection bead has a chamfer part on an edge of a contact surface contacting the top surface of the wafer and at least one chamfer part contacting at least one of the plurality of apertures.

15. The apparatus of claim 14, wherein each of the plurality of apertures is connected to a common solder tank.

16. The apparatus of claim 14, wherein each of the plurality of apertures is connected to a respective one of a plurality of solder tanks.

17. The apparatus of claim 14, wherein the chamfer part is on an outer circumference and the at least one aperture of the injection head.

18. The apparatus of claim 17, wherein the chamfer part is on a following edge of the injection head in a forward direction of travel.

* * * * *